United States Patent [19]
Latham, IV et al.

[11] Patent Number: 5,811,882
[45] Date of Patent: *Sep. 22, 1998

[54] ON-CHIP SHIELDING COAXIAL CONDUCTORS FOR MIXED-SIGNAL IC

[75] Inventors: George Robert Latham, IV; Allen James Mann, both of Sunnyvale; Vincent Anthony Condito, Palo Alto, all of Calif.

[73] Assignee: Philips Electronics North America Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 718,796

[22] Filed: Sep. 24, 1996

[51] Int. Cl.⁶ .................................................. H01L 29/41
[52] U.S. Cl. ......................... 257/776; 257/773; 257/664; 257/508
[58] Field of Search .................................. 257/664, 773, 257/750, 776, 508

[56] References Cited

U.S. PATENT DOCUMENTS

| | | | |
|---|---|---|---|
| 4,379,307 | 4/1983 | Soclof | 257/664 |
| 4,673,904 | 6/1987 | Landis | 333/238 |
| 4,743,710 | 5/1988 | Shieber et al. | 174/68.5 |
| 4,776,087 | 10/1988 | Cronin et al. | 29/828 |
| 5,136,357 | 8/1992 | Hesson et al. | 257/664 |
| 5,150,189 | 9/1992 | Shirai et al. | 357/53 |
| 5,231,300 | 7/1993 | Terashima et al. | 257/370 |
| 5,233,133 | 8/1993 | Iwasaki et al. | 174/250 |
| 5,357,138 | 10/1994 | Kobayashi | 257/664 |
| 5,363,550 | 11/1994 | Aitken et al. | 29/828 |
| 5,378,852 | 1/1995 | Swailes | 174/251 |
| 5,491,358 | 2/1996 | Miyata | 257/355 |
| 5,522,132 | 6/1996 | Mattel | 29/846 |
| 5,589,727 | 12/1996 | Cronin | 257/532 |

FOREIGN PATENT DOCUMENTS

| | | | |
|---|---|---|---|
| 0354512 | 2/1990 | European Pat. Off. . | |
| 58-148436 | 9/1983 | Japan | 257/664 |
| 62-63447 | 3/1987 | Japan . | |
| 1-290238 | 11/1989 | Japan | 257/508 |
| 3-229467 | 10/1991 | Japan . | |
| 4-142074 | 5/1992 | Japan . | |

*Primary Examiner*—David B. Hardy

[57] ABSTRACT

In an integrated circuit, capacitively coupled interference (digital-switching or analog cross-talk) is prevented by constructing shielded coaxial conductors for the analog signals. The coaxial configuration comprises a primary conductor for the analog signal surrounded by a secondary conductor that is electrically isolated from the primary one and that is connected to a clean power bus such as GND or Vdd. The outer secondary conductor shunts the digital noise energy to the power bus, preventing it from injecting noise into the analog primary conductor. A similar coaxial configuration is provided with a bootstrap follower to reduce the effects of parasitic capacitance for high-speed and small analog signals.

6 Claims, 4 Drawing Sheets

ON-CHIP SHIELDING COAXIAL CONDUCTORS FOR MIXED-SIGNAL IC

FIELD OF THE INVENTION

The invention relates to an integrated circuit that has an analog-signal path. The invention relates in particular, but not exclusively, to an integrated circuit with a path for an analog signal and a path for a digital signal.

BACKGROUND ART

The ongoing trend in semiconductor technology is to integrate increasingly more functionalities on the same semiconductor chip and to reduce the dielectric separation between conductors. This development put specific demands on chips that include both analog and digital signal paths. The switching of the on-chip digital circuitry may well interfere with the operation of the susceptible, on-chip analog circuitry. At times, sensitive analog signals must route through digital circuitry and may pick up electrostatically induced error voltages. Several approaches are known to mitigate this problem to some extent.

For example, the lay-out can be optimized so that the analog portion is located as far away as possible from potential sources of digital switching noise. Analog signal leads are typically making detours to avoid crossing digital areas.

As another example, U.S. Pat. No. 5,491,358 teaches to form a P-type well between a first N-type substrate region accommodating the digital portion and a second N-type substrate region accommodating the analog portion. The P-type well is provided with an N-type diffusion and serves to shut off electrical noise between the regions and to absorb electrostatic surges.

In still another example, U.S. Pat. No. 5,231,300 teaches separating the power lines for the digital portion from the power lines for the analog portion.

OBJECT OF THE INVENTION

The inventors have recognized that not only the signal processing itself, but also the transport of analog and digital signals across the chip may significantly contribute to the loss of analog signal integrity caused, e.g., by digital switching or by analog cross-talk.

It is an object of the invention to secure analog signal integrity by means of preventing internal interference of sensitive analog circuits by other nearby circuits on a mixed-signal chip, specifically through capacitive coupling of the on-chip signal leads.

SUMMARY OF THE INVENTION

The invention, therefore, provides an electronic circuit integrated in semiconductor material with measures to prevent capacitively coupled interference by constructing an electrically conductive strip line configuration or coaxial configuration for the analog signal path.

More specifically, the integrated circuit according to the invention comprises a conductive path for conducting an analog signal. The path comprises an electrically conductive configuration having a primary conductor for conducting the analog signal, and a secondary conductor for shielding the analog signal. The secondary conductor is electrically isolated from, and is arranged substantially parallel with, the primary conductor.

In a particular embodiment, the secondary conductor is electrically connected to a power supply node such as Vdd or GND, or to another fixed reference voltage in order to shunt the electrostatic noise energy away from the analog signal of the primary conductor.

In another embodiment, the secondary conductor is connected to the primary connector via a bootstrap follower. This arrangement reduces effects of parasitic capacitances and shields the analog signal from capacitively coupled noise by keeping a fixed potential difference between the primary and secondary conductors.

In a coaxial configuration of the analog signal path, the secondary conductor comprises a first conductive layer substantially underneath the primary conductor, and a second conductive layer lying substantially over the primary conductor and being electrically connected to the first conductive layer. The primary conductor is sandwiched between the first conductive layer and the second conductive layer.

Both the first and second conductive layers are created from, for example, metal depositions in a multi-metal layer IC-process. Alternatively, the first conductive layer comprises, for example, a doped region located in the semiconductor material, whereas the second conductive layer is formed out of deposited metal. The doped region is electrically isolated from, and located substantially underneath, the primary conductor. Preferably, the semiconductor material is of a first conductivity type and the doped region is of a second conductivity type, opposite to the first conductivity type. The doped region, or well, together with its depletion layer, serves to eliminate substrate noise from reaching the primary conductor.

The invention is not restricted to a specific semiconductor material used, e.g., silicon, gallium-arsenide, or to the specific conductivity type of substrate and doped regions (e.g., P-well process, N-well process).

BRIEF DESCRIPTION OF THE DRAWINGS

The invention is explained in further detail by way of example and with reference to the accompanying drawings, wherein.

Throughout the figures, same reference numerals indicate similar or corresponding features.

DETAILED EMBODIMENTS

First embodiment

Figure 1:
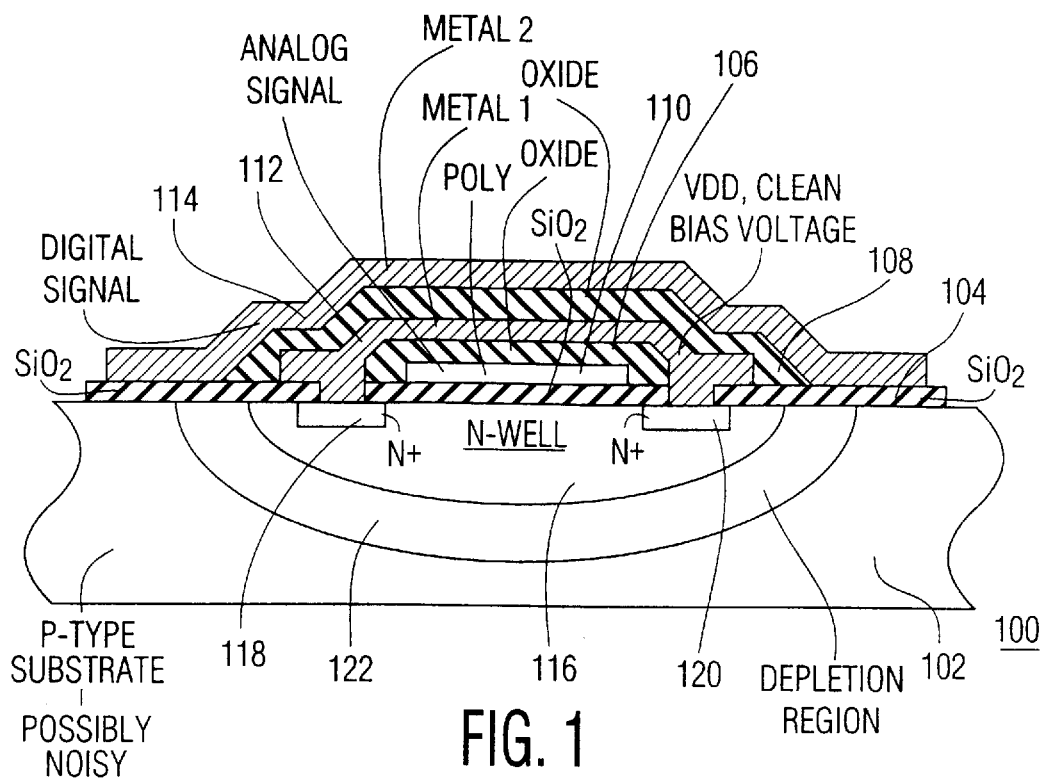
FIGS. 1–4 are diagrams of cross-sections of IC-embodiments of analog and digital signal paths in the invention.

FIG. 1 is a diagram of a cross-section of a first embodiment 100 of an integrated circuit in the invention, the circuit having analog and digital signal paths. The analog path has a coaxial configuration. The IC-process used is, e.g., a two-layer metal process.

Embodiment 100 includes a silicon semiconductor substrate 102, first, second and third silicon oxide layers 104, 106 and 108, a polycrystalline silicon conductor 110, and first and second metal layers 112 and 114. Substrate 102 in this example is a P-type substrate. Substrate 102 includes an N-well 116. N-well 116 includes heavily doped (N+)-regions 118 and 120 that form electrical contacts to first metal layer 112 via holes in first oxide layer 104. Polysilicon conductor 110 forms the primary conductor carrying the analog signal. Preferably, polysilicon conductor 110 is of a low-resistance type, using, e.g., a silicide coating. Conductor 110 is isolated from N-well 106 by field oxide 104, and from first metal layer 112 by deposited silicon oxide layer 106. Metal layer 114 forms the conductive path for the digital signal. In this example, the analog track formed by polysilicon layer 110 and the digital track formed by metal layer 114 cross each other substantially perpendicularly.

First metal layer 112 and N-well 116 are electrically interconnected via contact holes over heavily doped regions 118 and 120 to form the secondary conductor surrounding primary conductor 110. Sequences of contact holes extend at both sides of, and in parallel to, polysilicon layer 110. The contact holes are preferably minimally spaced to provide low overall electrical resistance.

Secondary conductor 112/116 is connected to a clean reference voltage node, e.g., clean bias Vdd or clean GND, by means of vias (not shown).

A depletion region 122 is present between N-well 116 and P-type silicon substrate 102. The combination of N-well 116 and depletion layer 122 serves to prevent substrate noise from reaching primary conductor 110. The substrate noise stems from, e.g., charge injection into substrate 102 by switching digital devices (not shown). First metal layer 112 shields primary conductor 110 from the switching noise of a digital signal carried by second metal 114, by shunting the digital noise to the power line.

Note that in the absence of digital signal paths, a strip line configuration can be formed for the analog signal path consisting of doped region 116 in parallel to primary conductor (polysilicon or metal) 110 as a guard against substrate noise.

Second embodiment

Figure 2:
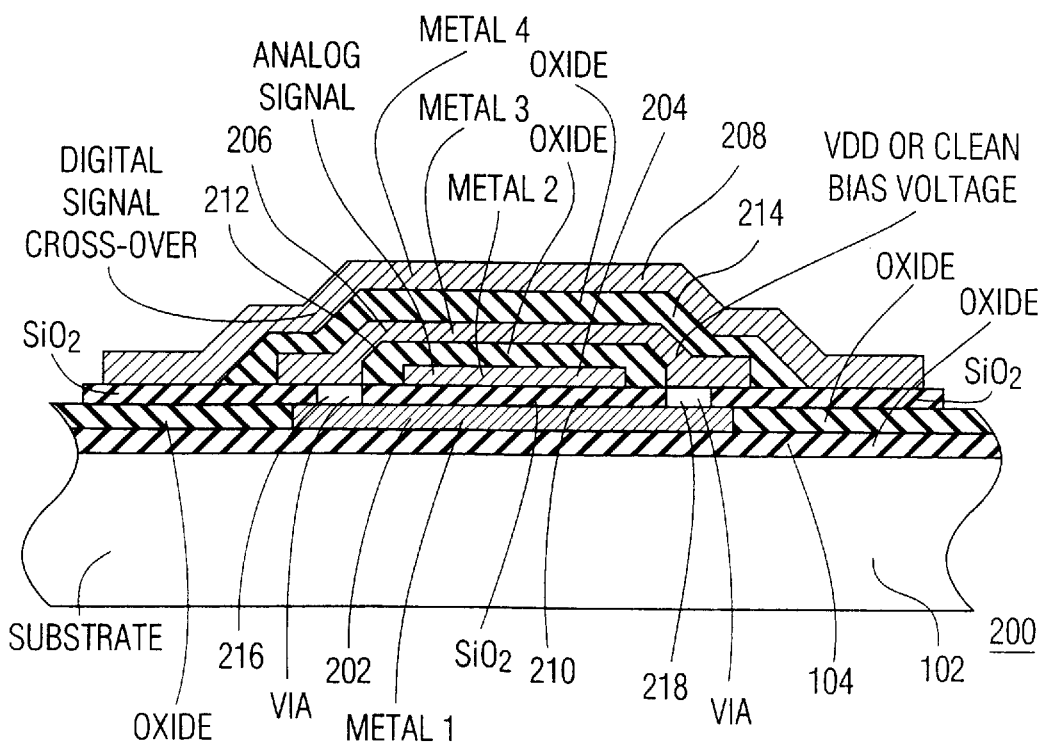

FIG. 2 is a diagram of a cross-section of a second embodiment 200 of a circuit in the invention. The analog signal path has a coaxial configuration. The IC-process used is a four-layer metal process.

The signal path now is implemented in a structure of successive layers of metals 202, 204, 206 and 208 and silicon oxide layers 210, 212 and 214, silicon oxides and metals being arranged alternately. Metal layer 204 is the primary conductor for the analog signal. Metal layer 204 is sandwiched between oxide layers 210 and 212. Shielding metal layers 202 and 206 are electrically interconnected to each other through vias 216 and 218, and are connected to a reference voltage. Oxide layer 214 isolates shielding layer 206 from digital signal path 208, crossing the analog signal path 204 substantially perpendicularly.

Third embodiment

Figure 3:
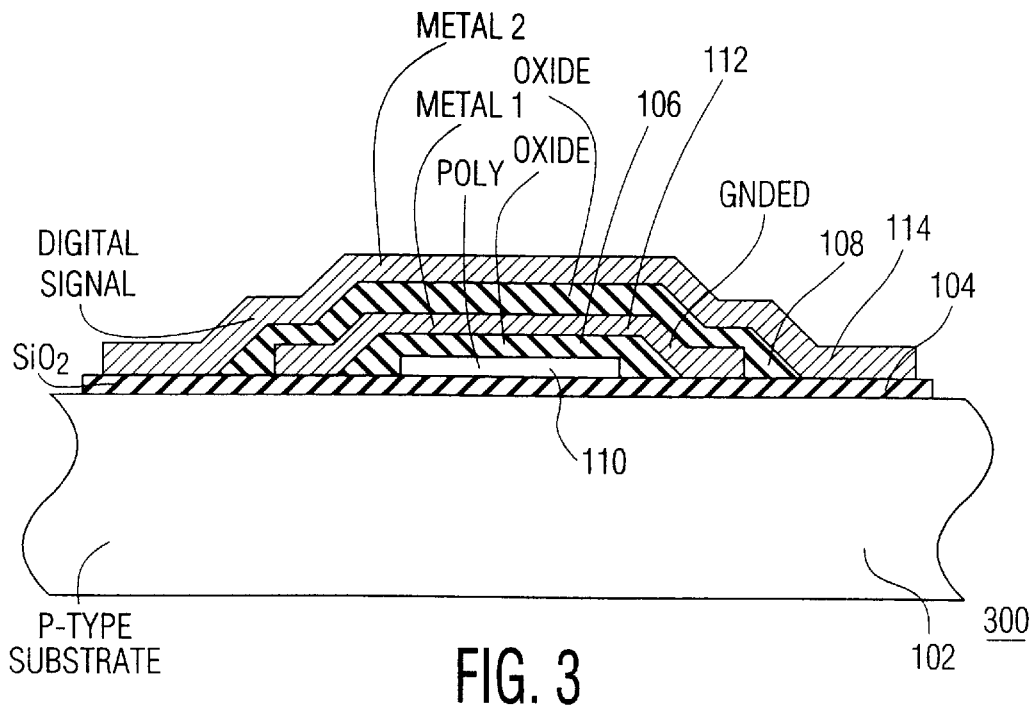

FIG. 3 is a diagram of a cross-section of a third embodiment 300 of a circuit in the invention, wherein the analog path has a strip line configuration. The IC-process used is a two-layer metal process.

Embodiment 300 lacks N-well 116 and N-well contacts 118 and 120 of embodiment 100 of FIG. 1. Shielding metal layer 112 is connected to the GND voltage supply. Embodiment 300 is simpler and less expensive than embodiment 100. For less-noisy environments and for less sensitive analog circuits, such simpler configuration is preferred. Embodiment 300 is used in situations with minimal substrate noise.

Fourth embodiment

Figure 4:
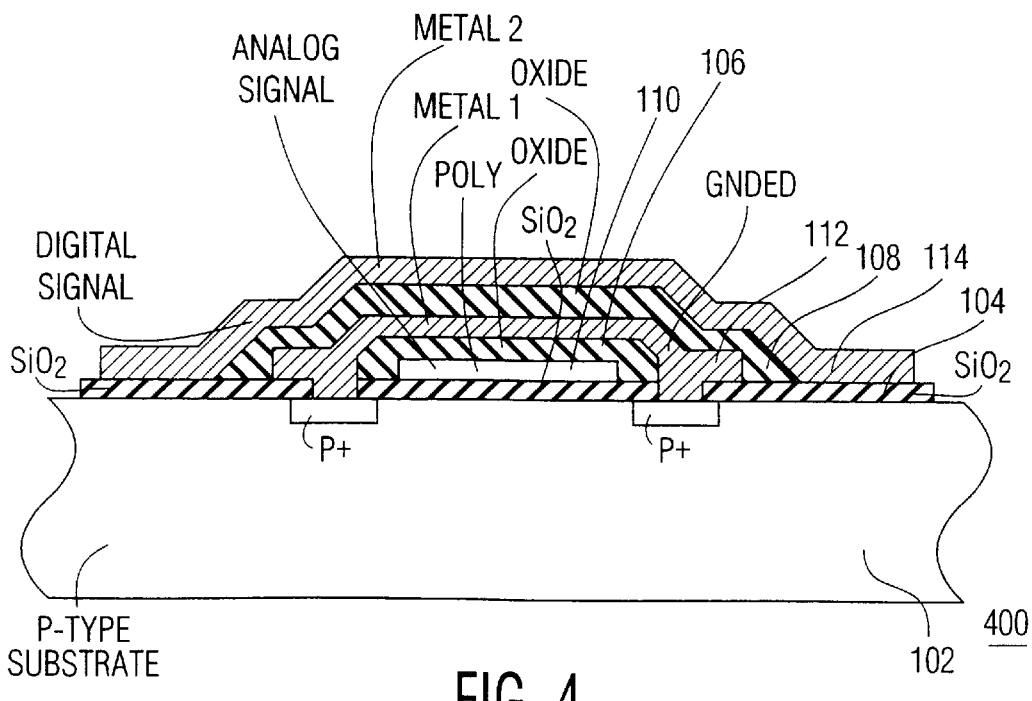

FIG. 4 is a diagram of a cross-section of a fourth embodiment 400 of a circuit with analog and digital signal paths in the invention. The analog path has a coaxial configuration. The IC-process used is a two-layer metal process.

Embodiment 400 differs from embodiment 300 by having shielding metal layer 112 connected to the P-substrate 102 via highly doped (P+)-regions. P-substrate 102 itself is connected to the GND terminal in order to provide the necessary substrate-potential. In an N-well CMOS-process, the P-substrate is connected to GND and the N-well is connected to the positive supply voltage VDD in order to reverse-bias the PN-junction in between.

The examples of FIGS. 1–4 show a configuration of analog signal paths 110, 204 and digital signal paths 114, 208. It is clear to the skilled person that conductors 114 and 208 can be used for routing a second analog signal instead of the digital signal. The layered configuration according to the invention then serves to prevent the analog signal paths to interfere with each other.

Signal guarding or bootstrap configuration

Figure 5:
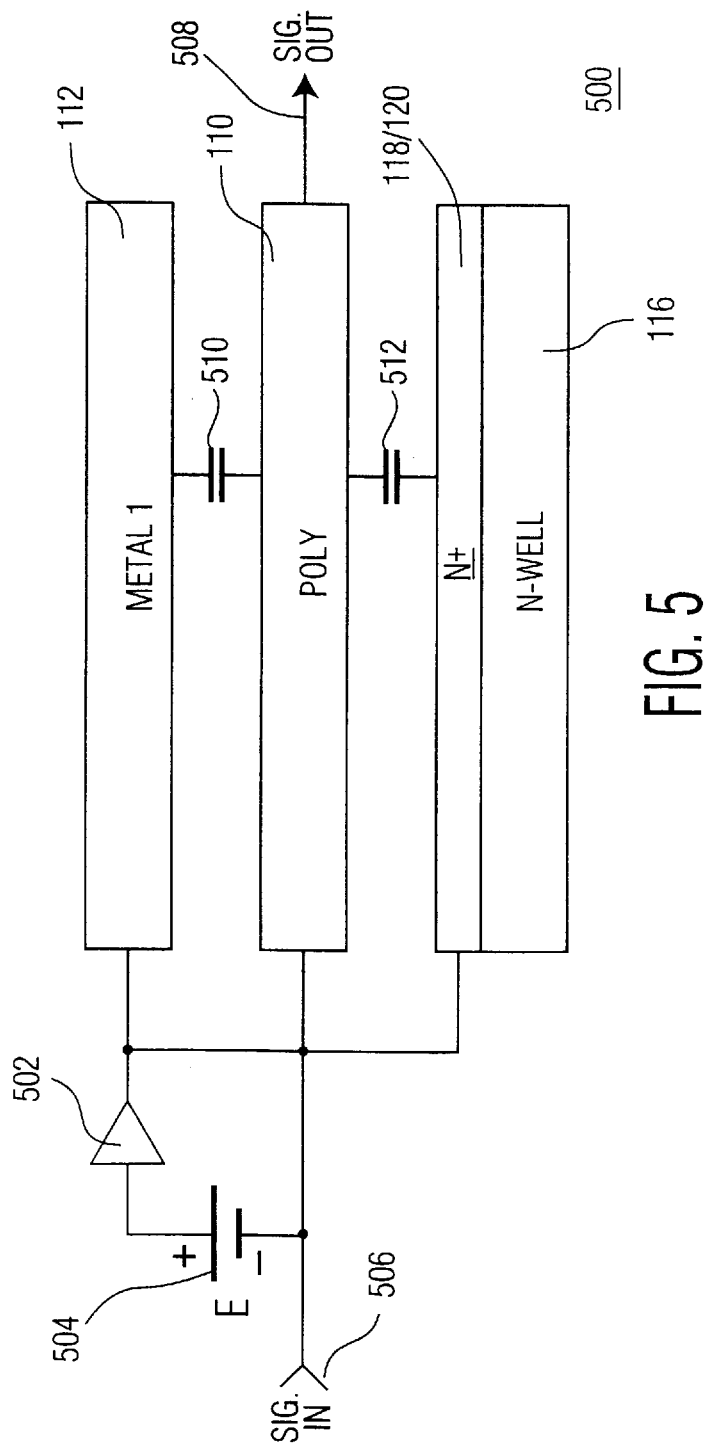
FIG. 5 is a block diagram of an integrated coaxial analog signal path to reduce the effects of parasitic capacitance according to the invention.

The coaxial structure, e.g., embodiment 100 or embodiment 200 can be used for signal guarding of small analog signals or high-speed analog signals. This technique reduces the effects of parasitic capacitances and provides high electrical-noise isolation. Referring to FIG. 5, a block diagram is shown of a coaxial or strip line configuration 500.

Configuration 500 comprises primary conductor 110 in polycrystalline silicon, and secondary conductor 112 as shielding metal layer, N-well 116, and highly doped N+contacts 118/120. Metal 112 and N-well 116 are electrically connected to the same AC potential as polysilicon layer 110 through an amplifier 502 having a gain of substantially unity. A voltage source 504 is provided merely to define the operating point of amplifier 502. Polysilicon layer 110 is connected between an input 506 and an output 508.

Configuration 500 is that of a follower bootstrap and is operative to reduce capacitive attenuation of the analog signal by dynamically keeping a substantially zero voltage difference between the analog signal and its surrounding.

Consider a hybrid integrated circuit, e.g., a microcontroller (not shown) provided with on-chip analog comparators (not shown), wherein the comparator inputs share bonding pads (not shown) with multi functional digital I/O. These pads are located remotely from the analog functional blocks, and the analog inputs in polysilicon layer 110 cross under a large number of digital conductors in second metal layer 114. Further, consider a coaxial interconnection 110/112/118/120 between the bonding pads and the analog functional blocks. Note that primary conductor 110 and its shield 112/116 functionally form a distributed RC low-pass filter with a cut-off frequency of, say, between 1 and 10 MHZ, depending on lay-out and process parameters. Typically, the polysilicon of conductor 110, when using a silicide, has a resistance of 2.5Ω per square (Ω/□). A typical value of the capacitance of the coaxial interconnection is 1 fF per square $\mu$m. For a length of 10 mm and a width of 5 $\mu$m of polysilicon layer 110, this would amount to a resistance R of 5000Ω and a capacitance C of 50 pF. Suppose that a suitable buffer (not shown) were to be connected at output 508 that represents a low load capacitance of, say, 50 fF such as for a source follower. The capacitance of the coaxial interconnection, schematically drawn as capacitors 510 and 512, would then fully dominate the capacitance of the input buffer. The RC-time of the coaxial connection then is 250 nanoseconds, and the cut-off frequency equals $1/(2\pi RC)$ or 0.6 MHZ.

Circuit block diagram

Figure 6:
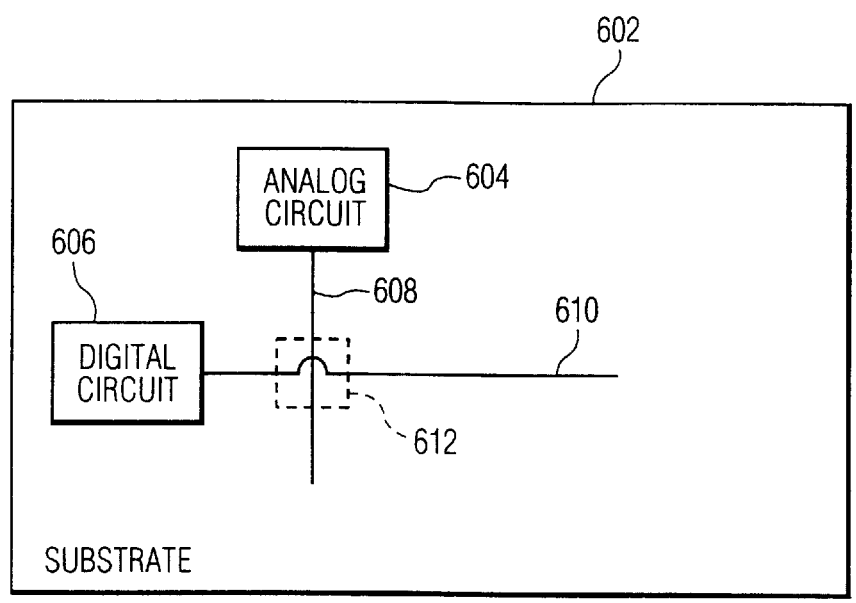
FIG. 6 is a block diagram of part of a circuit according to the invention.

FIG. 6 is a block diagram of part of a circuit 600 in the invention. Circuit 600 comprises semiconductor substrate 602 that accommodates an analog circuit 604 and a digital circuit 606. A conductive path 608 is electrically connected to analog circuit 604 for conducting an analog signal to or from circuit 608. A conductive path 610 is electrically connected to digital circuit 606 for conducting a digital signal to or from circuit 606. Paths 608 and 610 are electrically isolated from each other. An area 612 indicates where paths 610 and 612 cross each other perpendicularly. The diagrams of FIGS. 1–4 clarify the spatial configuration of the dielectrics and conductors of paths 608 and 610 in area 612.

Configuration 500 now uses bootstrap amplifier 502 to cancel the effect of capacitors 510 and 512. This raises the frequency limit for higher-speed applications significantly. Canceling the capacitance of the coaxial line raises the cut-off frequency in the previous numerical example to 637 MHZ.

What we claim is:

1. An electronic circuit integrated in a semiconductor substrate and having:

analog circuitry:

digital circuitry;

a first conductive path electrically connected to the analog circuitry for conducting an analog signal;

a second conductive path electrically connected to the digital circuitry for conducting a digital signal and electrically isolated from the first conductive path;

wherein the first conductive path comprises:

a primary conductor for conducting the analog signal; and a secondary conductor electrically isolated from, and substantially parallel with, the primary conductor for shielding the analog signal from interference caused by switching of the digital circuitry;

and wherein:

the second conductive path and the first conductive path cross each other substantially perpendicularly.

2. The circuit of claim 1, wherein the first conductive path for conducting the analog signal is located between the substrate and the second conductive path for conducting the digital signal.

3. The circuit of claim 1, wherein the secondary conductor is connected to the primary connector via a bootstrap follower for reducing effects of parasitic capacitances and for the shielding of the analog signal.

4. The circuit of claim 1, wherein:

the analog signal path has a coaxial configuration;

the secondary conductor comprises:

a first conductive layer underneath the primary conductor; and a second conductive layer over the primary conductor and electrically connected to the first conductive layer so as to enclose the primary conductor;

the first conductive layer comprises a doped region located in the semiconductor material underneath the primary conductor and stretching over the whole width of the primary conductor;

the doped region is electrically isolated from the primary conductor; and the doped region and the substrate have opposite conductivity types.

5. The circuit of claim 1, wherein:

the analog signal path has a coaxial configuration;

the secondary conductor comprises:

a first conductive layer underneath the primary conductor; and a second conductive layer over the primary conductor and electrically connected to the first conductive layer so as to enclose the primary conductor;

the first conductive layer comprises a doped region located in the semiconductor material;

the doped region is electrically isolated from the primary conductor; and the doped region and the substrate have the same conductivity type.

6. The circuit of claim 1, wherein the primary conductor comprises polycrystalline silicon.

* * * * *